(12) United States Patent
Döttling et al.

(10) Patent No.: US 7,821,999 B2
(45) Date of Patent: Oct. 26, 2010

(54) IDENTICAL PUNCTURING OF UE IDENTIFICATION DATA AND LOAD DATA IN THE HS-SCCH CHANNEL

(75) Inventors: Martin Döttling, Neubiberg (DE); Jürgen Michel, München (DE); Bernhard Raaf, Neuried (DE); Ralf Wiedmann, München (DE)

(73) Assignee: Siemens Aktiengesellschaft, Munich (DE)

( * ) Notice: Subject to any disclaimer, the term of this patent is extended or adjusted under 35 U.S.C. 154(b) by 108 days.

(21) Appl. No.: 12/345,416

(22) Filed: Dec. 29, 2008

(65) Prior Publication Data

US 2009/0109934 A1    Apr. 30, 2009

Related U.S. Application Data

(63) Continuation of application No. 10/517,851, filed as application No. PCT/DE03/01872 on Jun. 3, 2003, now Pat. No. 7,471,660.

(30) Foreign Application Priority Data

Jun. 13, 2002   (DE) ................................ 102 26 394

(51) Int. Cl.
   *H04B 7/216* (2006.01)
(52) U.S. Cl. ........................................ 370/335; 370/342
(58) Field of Classification Search ................. 370/335, 370/342, 320, 313, 203, 208; 375/260, 295, 375/253, 246, 136, 147, 150
See application file for complete search history.

(56) References Cited

U.S. PATENT DOCUMENTS 6,732,316 B1 *   5/2004   Tong et al. ................... 714/756

(Continued)

FOREIGN PATENT DOCUMENTS

DE            100382229         3/2001

(Continued)

OTHER PUBLICATIONS

3GPP TS 25.212 V5.0.0 (Mar. 2003) 3rd Generation Partnership Project; Technical Specification Group Radio Access Network; Multiplexing and Channel coding (FDD) (Release 5) pp. 1-74.

(Continued)

*Primary Examiner*—George Eng
*Assistant Examiner*—Brandon J Miller
(74) *Attorney, Agent, or Firm*—King & Spalding L.L.P.

(57) ABSTRACT

The present invention relates to a method for transmitting data via a physical channel in a communication system, the channel being used by at least one first communication device and one second communication device and transmitting data with a defined bit rate. According to the present invention, the data to be transmitted (TD) is composed of load data (LD) and identification data (ID) for identifying the second communication device, the load data (LD) and identification data (ID) are coded separately from one another, the respective coding (C_LD, C_ID) takes place in such a way that an identical bit rate is achieved after the coding operation for the load data (LD) and the identification data (ID) and the rate is matched to the bit rate that has been defined for the physical channel by a rate matching mode, which defines which bits are punctured or repeated in a data stream. The rate matching model for load data (LD) and identification data (ID) is identical.

9 Claims, 5 Drawing Sheets

U.S. PATENT DOCUMENTS

| | | | | |
|---|---|---|---|---|
| 6,741,580 B1 | * | 5/2004 | Kim et al. | 370/337 |
| 6,744,744 B1 | * | 6/2004 | Tong et al. | 370/320 |
| 6,973,579 B2 | | 12/2005 | Dick et al. | 713/200 |
| 7,076,726 B1 | | 7/2006 | Yun et al. | 714/790 |
| 7,162,675 B2 | * | 1/2007 | Das et al. | 714/751 |
| 7,180,902 B1 | * | 2/2007 | Raaf et al. | 370/441 |
| 7,471,660 B2 | * | 12/2008 | Dottling et al. | 370/335 |
| 2003/0023909 A1 | * | 1/2003 | Ikeda et al. | 714/702 |
| 2004/0001428 A1 | | 1/2004 | Datta et al. | 370/208 |
| 2004/0028020 A1 | | 2/2004 | Frederiksen et al. | 370/342 |
| 2004/0181618 A1 | | 9/2004 | Dottling et al. | 710/33 |
| 2005/0078648 A1 | | 4/2005 | Nilsson | 370/342 |

FOREIGN PATENT DOCUMENTS

| | | |
|---|---|---|
| EP | 1091517 | 11/2001 |

OTHER PUBLICATIONS

3GPP TSG-RAN WG1#25 Feb. 9-12, 2002, Tdoc R1-02-0493 "Improved UE Specific CRC Generation".

XP-002256032—Multiplexing and channel coding (TDD), Mar. 2002, pp. 22-29.

XP-002256033—"Change Request R1-02-0605, Rate Matching and Channel Coding for HS-SCCH", Apr. 12, 2002, pp. 1-5.

* cited by examiner

US 7,821,999 B2

IDENTICAL PUNCTURING OF UE IDENTIFICATION DATA AND LOAD DATA IN THE HS-SCCH CHANNEL

RELATED APPLICATION

This application is a Continuation of U.S. patent application Ser. No. 10/517,851 filed Dec. 13, 2004 now U.S. Pat. No. 7,471,660, which is a U.S. National Stage Application of International Application No. PCT/DE03/01872 filed Jun. 3, 2003, which designates the United States of America, and claims priority to German Application No. DE 102 26 394.9 filed Jun. 13, 2002. The contents of these applications are incorporated herein in their entirety by this reference.

BACKGROUND OF THE INVENTION

The present invention relates to a method for transmitting data wherein the transmission bit rate is defined via the physical channel.

Owing, for example, to their being embedded in specific transmission formats, transmission channels in mobile radio systems only offer fixed data or, as the case may be, raw data transmission rates, while the data rates of different signals or applications differ therefrom. Such data rates consequently need to be mutually matched at an interface.

Matching of such type is described below using an example taken from the UMTS standard:

In the UMTS (Universal Mobile Telecommunication System), data packets are sent to a mobile station (UE=User Equipment) on the high-speed downlink shared channel (HS-DSCH). The associated control information, such as the channelizing codes used for the HS-DSCH and the modulation scheme, such as QPSK (Quadrature Phase Shift Keying) or 16 QAM (16 Quadrature Amplitude Modulation), is sent on the high-speed shared control channel (HSSCCH). Such control information or, as the case may be, this load data is linked to identification information so that the receiving mobile station can recognize that the information on the HS-SCCH is intended for it. "Masking of the data" is a term also used in this connection. Prior to linking, both load data and identification data undergo coding and, in each case, immediately ensuing rate matching.

This process is highly complex, however, which is disadvantageous particularly where the mobile radio device is concerned inasmuch as such coding and rate matching processes are cancelled again in order to arrive at the original (load) data.

Proceeding from this prior art, the present invention seeks to carry out rate matching in a less complex manner in one channel used jointly by a number of communication participants.

SUMMARY OF THE INVENTION

The present invention centers on organizing rate matching for load data and identification data, serving to indicate for what device the data is intended, according to a common scheme, with overall coding being effected in one channel used jointly by a number of communication participants. As such, decoding, in particular on the recipient's side, is made less complex. A further feature of the present invention is aimed at providing a rate matching pattern that permits rate matching in accordance with a common scheme while retaining the original information as faithfully as possible.

Additional features and advantages of the present invention are described in, and will be apparent from, the following Detailed Description of the Invention and the Figures.

DETAILED DESCRIPTION OF THE INVENTION

Overall Coding Of Load And Identification Data

Figure 1:
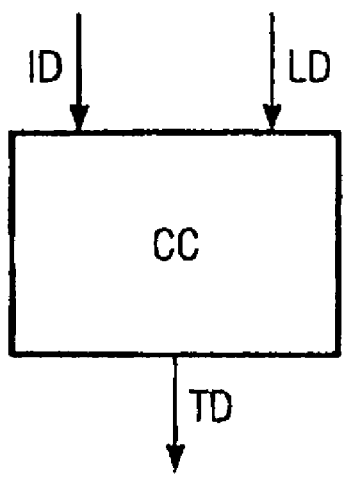
FIG. 1 is an overview of overall coding in a channel where the data being transmitted is masked with the aid of the identification data.

FIG. 1 is a schematic of overall coding for load data (LD: Load Data) and identification data (ID: Identification Data) sent on a jointly used channel in a communication system. Transferred data (TD: Transferred Data) here consists of load data (LD) that is linked to the identification data ID in order to make it apparent for which recipient the transferred data TD is intended. Load data LD and identification data ID is linked as part of overall coding, in most cases channel coding (CC: Channel Coding). Channel coding is understood as referring to the matching of digital values to the physical transmission medium, referring to, for instance, coding followed immediately by rate matching. Overall coding refers in this case to the coding, rate matching, and linking of the load and identification data. It is not, however, absolutely essential for all the listed steps to be carried out. Overall coding also can, for instance, include coding alone with no rate matching.

Although the scheme shown in FIG. 1 is known per se, the prior art and the present invention differ with respect to the procedure employed for overall coding.

Figure 2:
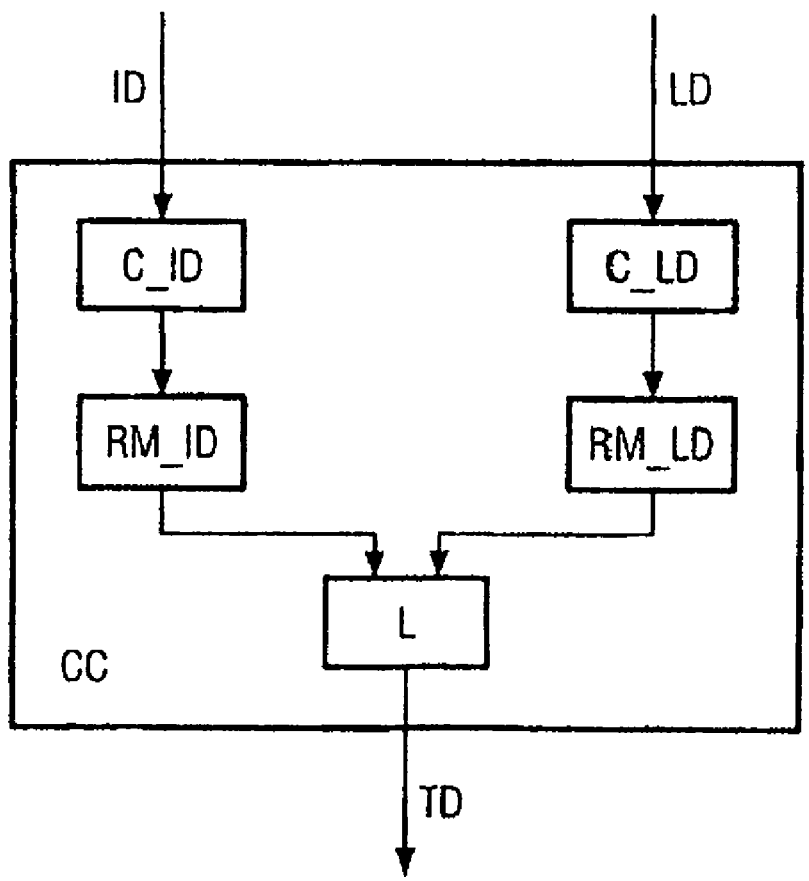
FIG. 2 is a scheme showing the individual operations involved in overall coding.

Individual procedural blocks within overall coding CC are shown broken down in FIG. 2. The load data LD is first subjected to coding C_LD. Redundancy is added to the load data LD in the course of such coding, for which, in particular, convolutional codes are used, as a result of which the sent data TD can be recovered more reliably on the recipient's side. The code respectively employed for coding is characterized by its code rate R=K/N, where K is the number of data bits or message bits to be transmitted and N is the number of bits present after coding. As a rule, the efficiency of the code is greater the lower the code rate. However, a problem associated with the coding is that the data rate is reduced by the factor R. In order to match the data rate of the coded data stream to the respectively possible transmission rate, rate matching RM_LD is performed in the transmitter whereby, in keeping with a specific pattern, bits are either removed from or repeated in the data stream. The removal of bits is referred to as "puncturing" and their repetition is referred to as "repeating".

The identification data ID is analogously first subjected to coding C_ID and then to rate matching RM_ID. The identification data and load data are then linked to each other in a linking operation L, through which the data TD being transferred is formed.

Although the procedure shown in FIG. 2 is known in terms of its principle, the prior art and the present invention differ in the way rate matching is implemented for the load data LD and identification data ID.

Figure 3:
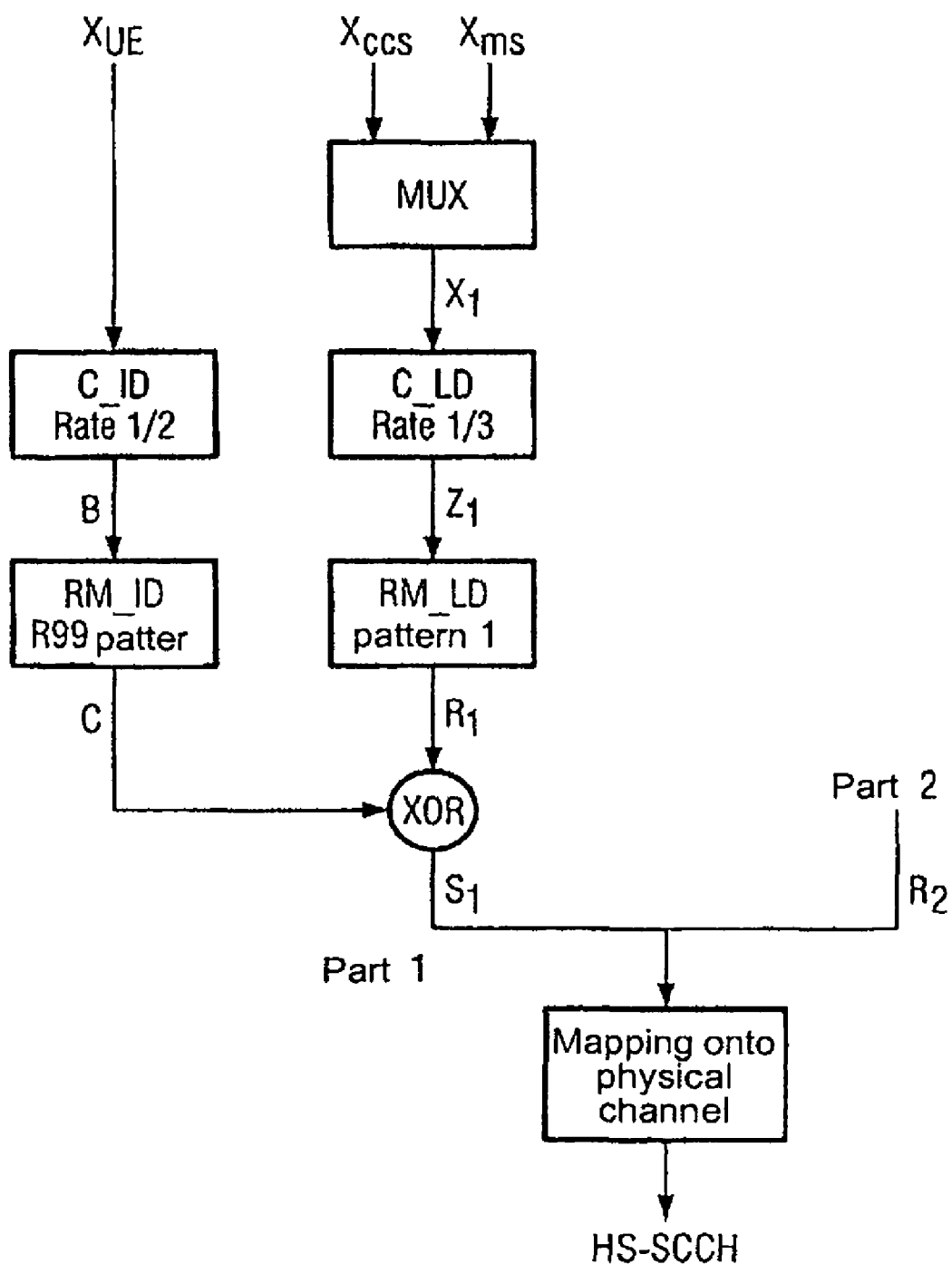
FIG. 3 shows the manner in which overall coding has been achieved hitherto in the HS-SCCH according to the prior art.

FIG. 3 illustrates the implementation of overall coding of HS-SCCH Part 1 according to the current UMTS standard specification (FDD, Release 5). The load data LD is here formed by the channel information bits $x_{ccs,1}$, $x_{ccs,2}$, ..., $x_{ccs,7}$. The channel information bits are referred to in specialist technical circles as "channelization code set bits". Modulation scheme bit $x_{ms,1}$ also flows into the load data. Such load data is encoded via a rate 1/3 convolutional encoder according to the standard established in 1999 (Release 99). Eight tail bits appended to the end of the bit block prior to coding enable simpler and more reliable decoding on the recipient's side. The multiplexer MUX enables channel information bits $X_{ccs}$ and the modulation scheme bit $X_{ms}$ to be interrogated in an alternating manner. The totality of data present after the multiplexer's operations is referred to as $X_1$.

16 bits are thus present at the input side of the coder or encoder or, as the case may be, prior to the coding operation C_LD, whereas 48 bits are present at the output side of the encoder Encod or, as the case may be, after the coding operation C_LD, owing to the rate 1/3. Let this coded bit block be designated $Z_1$. The index 1 signifies that it is a quantity concerning Part 1 of the HS-SCCH. Part 1 of this control channel contains data which the recipient must decode immediately in order to process incoming data on the HS-DSCH (HS-DSCH=HS Downlink Shared Channel) accordingly. The presence of the data of part 2 is correspondingly less time-critical.

However, only 40 bits are available on the physical channel, which is to say the actual transmission channel, for transmission for Part 1 of the control channel HS-SCCH. In order to arrive from 48 bits to the 40 bits which can be physically transmitted in Part 1, rate matching is performed according to the following rate matching pattern (pattern 1): From the bit block or the sequence $Z_1$ proceeding from the coding operation C_LD, the bits are punctured at positions 1, 2, 4, 8, 42, 45, 47, 48. If use is made of a notation with a second index j, which identifies the bit position and, in the case shown, runs from 1 to 48, then the bits being punctured can be specified as $Z_{1,1}$, $Z_{1,2}$, $Z_{1,4}$, $Z_{1,8}$, $Z_{1,42}$, $Z_{1,45}$, $Z_{1,47}$, $Z_{1,48}$. The first index indicates as previously that it is Part 1 of the HS-SCCH. In this notation, the sequence $R_{1,1}$, $R_{1,2}$, ... $R_{1,40}$ will then be present in FIG. 3 after the rate matching operation.

The control channel HS-SCCH is monitored by a number of mobile stations or mobile radio devices (UE: User Equipment). To identify the respectively addressed mobile station UE or, as the case may be, so that such mobile station can decode Part 1, and also so that a mobile station which is not addressed will recognize this fact, the load data, consisting of channel information data and of the modulation scheme, is identified via the identification data or, as the case may be, via a specific mask dependent on the mobile station's identification number. In the case illustrated here, what is termed a scrambling code (mask) specific to the mobile station's identification number is generated on the mobile station's 16-bit identification number (UE ID) via rate 1/2 coding according to the standard established in 1999 (Release 99).

The mobile station's identification number UE ID is assigned to the mobile station in the relevant cell by the respective base station.

Scrambling is understood as "personalizing" of the information. This is done via what are termed "scrambling codes", by which the signal is modified in order to separate or to split signals intended for individual terminals or base stations from each other.

To generate the scrambling code, the 16 bits of the mobile station's identification number UE ID $X_{ue,1}$, ... $X_{ue,16}$ and the appended eight tail bits are coded according to the 1999 standard (Release 99) via the rate 1/2 convolutional coder (C_ID). (16+8)×2=48 bits of a sequence B are then also present at the output of the convolutional coder. In order to arrive here at the length of 40 bits, for rate matching RM_ID the rate matching algorithm taken from the 1999 standard (Release 99) is used for puncturing (RM_ID), during which operation bits $b_1$, $b_7$, $b_{13}$, $b_{19}$, $b_{25}$, $b_{31}$, $b_{37}$, $b_{43}$ in the sequence B, consisting of bits $b_1$, $b_2$, ... $b_{48}$, where the index indicates the bit position, are punctured. The necessary reduction from 48 to 40 bits is produced with the sequence C, consisting of bits $c_1$, $c_2$, ... $c_{40}$, formed in this way.

Different rate matching patterns are therefore used for the branch of the load data LD and the branch of the identification data ID for rate matching, RM_LD and RM_ID respectively, of such data. The reasons for this are as follows:

The number of bits present in the branch with the identification data ID or, as the case may be, in the branch with the load data LD is generally not the same after the coding stage. The cause of this may lie both in the number of output bits, which is to say in the number of bits in the mobile station's identification number or, as the case may be, channel information bits or modulation information bits, and in the rate of coding. Different rate matching will then be necessary.

Coding in the coding stage $C_{LD}$ or, as the case may be, $C_{ID}$ serves inter alia to interlace the bits so that the original bit sequence $X_i$ or, as the case may be, $X_{UE}$ can be restored on the recipient's side even if transmission conditions are poor. Interlacing that is good in these terms will, of course, appear different for different input data $X_{UE}$ or, as the case may be, $X_i$ (=$X_{ccs}$ or $X_{ms}$), in particular also when different coding rates are used. Individual bits consequently have different significance after the coding stage. Such different significance depends on the number of coding stage input bits with which an output bit of the coding stage is associated. The greater the number of input bits flowing into the output bit, the more significant will be the output bit for restoring the original data. In one rate matching pattern, when data is punctured it is now preferable to puncture those bits having in present terms lesser significance. In other words when different coding is employed, such as with different convolutional coders, followed by rate matching, different rate matching patterns result in different distance properties in terms of the Hamming distances of the resulting code sequences or, as the case may be, codewords, and hence determine the efficiency of the coding.

The use of different rate matching patterns and the computing and storage requirements associated therewith pose only a minor problem in the base station as suitable hardware is available there for managing even highly complex computing processes. However, this does not apply to the receiving mobile station.

As already mentioned, the present invention seeks to make overall coding, rate matching in particular, less complex than it is at present, which is to say according to the specification according to Release 5.

A feature of the present invention is to perform rate matching for identification data ID and load data LD according to a common rate matching pattern. Basically, two approaches to a solution are conceivable here:

i) Using a common rate matching pattern but performing rate matching separately for load data LD and identification data ID.

ii) Using a common rate matching pattern and performing rate matching in common.

Figure 4:
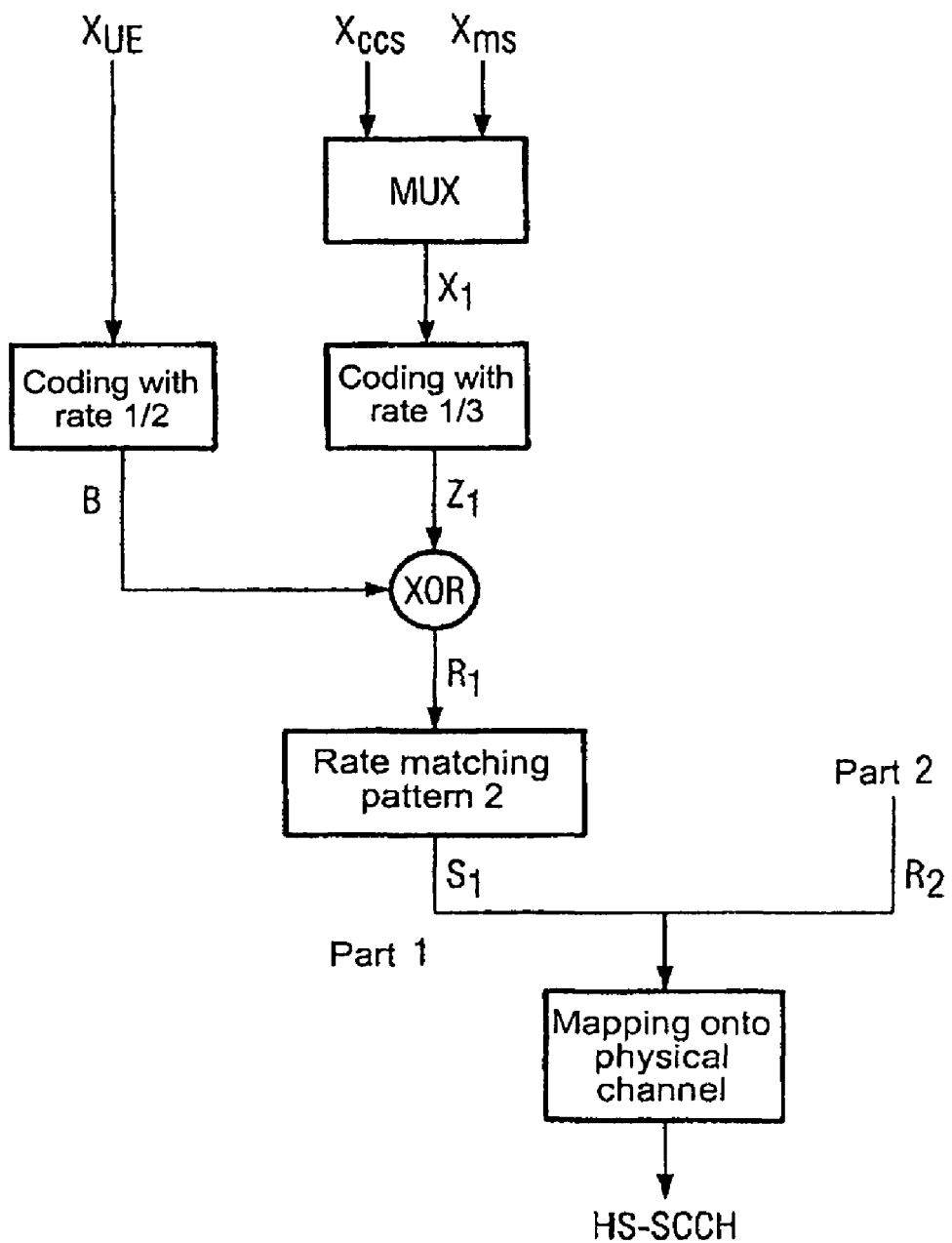
FIG. 4 is an exemplary embodiment of the present invention of overall coding in the HS-SCCH.

FIG. 4 shows a procedural flow embodied according to approach ii); likewise, for the example of the control channel HS-SCCH. In this case, the identification data ID, here designated identification bit sequence $X_{ue}$, and the channel information data, here $X_{ccs}$ and $X_{ms}$, are already linked to each other according to the respective coding C_LD or, as the case may be, C_ID, then subjected to common rate matching. Such linking is performed via, for instance, an XOR function if the two values a bit can in each case assume are defined with 0 and 1. If the values −1 and 1 are assumed, linking can be performed via a multiplication operation. It is, however, also possible to use other types of bit-by-bit linking.

The data proceeding from the coding operation is designated, analogously to FIG. 3, $Z_1$ in FIG. 4. As a departure from FIG. 3, the bit block or, as the case may be, bit sequence or sequence $R_1$ here designates the data prior to common rate matching but after linking.

The following advantages are achieved by a procedure according to approach i) or ii):

As rate matching is only performed with one rate matching pattern, decoding in the recipient device, such as the mobile station UE, is commensurately simpler. Reduced complexity is already achieved if rate matching is performed separately according to the same pattern for identification data ID and load data LD (approach i).

If rate matching is combined according to approach ii), this will result in further simplification.

Different Rate Matching Patterns

A further feature of the present invention is the provision of a rate matching pattern that is suitable as a common scheme approximately equally for load data LD and identification data ID. An aspect here, inter alia, is for the Hamming distance after linking to be as large as possible; for example, so that the linked data can be reconstructed as faithfully as possible if transmission was faulty. A large Hamming distance is desirable here also, in order, furthermore, to preserve the information content of the load data as well as possible. These and other criteria such as, for instance, the signal-to-noise ratio, are, however, not necessarily mutually independent, a fact that can result, inter alia, in the attempt to find an "optimized" rate matching pattern leading to a number of different rate matching patterns which, expressed mathematically, also could be designated as secondary minima of the optimizing problem. Among others, some variants have particular advantages for the common rate matching pattern:

a) Use of the present puncturing algorithm (Release 99):

Bits r1,1, r1,7, r1,13, r1,19, r1,25, r1,31, r1,37, r1,43 are punctured in the sequence r1,1, r1,2, ..., r1,48, thereby producing the sequence s1,1, s1,2 ... s1,40. An advantage of this is that only a small amount of matching is required in the system currently in use.

This puncturing pattern can, like other rate matching patterns, be shifted by, for example, an offset 0<=k<6. As such, bits $r_{1+k}$, $r_{7+k}$, $r_{19+k}$, $r_{25+k}$, $r_{31+k}$, $r_{37+k}$, $r_{43+k}$ are punctured in the case of the 1999 standard (Release 99).

b) The puncturing pattern optimized for the load data of Part 1 of the HS-SCCH "Pattern 1" [1] is used as the puncturing pattern:

Bits r1,1, r1,2, r1,4, r1,8, r1,42, r1,45, r1,47, r1,48 of the sequence r1,1, R1,2, ..., r1,48 are punctured, thereby producing the sequence s1,1, s1,2 ... $s_{1,40}$. This variant is advantageous as it optimally codes the HS-SCCH data and, furthermore, because the sequences for masking the data in the code space are distanced further from each other, which is to say have a larger what is termed "Hamming distance", than in the case of puncturing according to the Release 99 puncturing algorithm.

The term "Hamming distance" is understood to be the number of bits by which two equally long codewords differ. This is used for error detection by comparing received data units with valid characters. Any correction required is performed applying the probability principle.

c) A new puncturing pattern which simultaneously optimizes the coding characteristics of the data of Part 1 of the HS-SCCH and the detection possibilities of masking with the UE ID, can be achieved through optimization whereby the secondary conditions are pre-defined by the data structure in the identification data branch and in the load data branch.

Simplified Decoding On The Recipient'S Side

As already explained, the proposed simplification of rate matching offers a major advantage particularly on the recipient's side, thus in a mobile station, for example, owing to less complex decoding.

Differences in decoding as performed at present and as can be performed according to the present invention are explained below.

Figure 5:
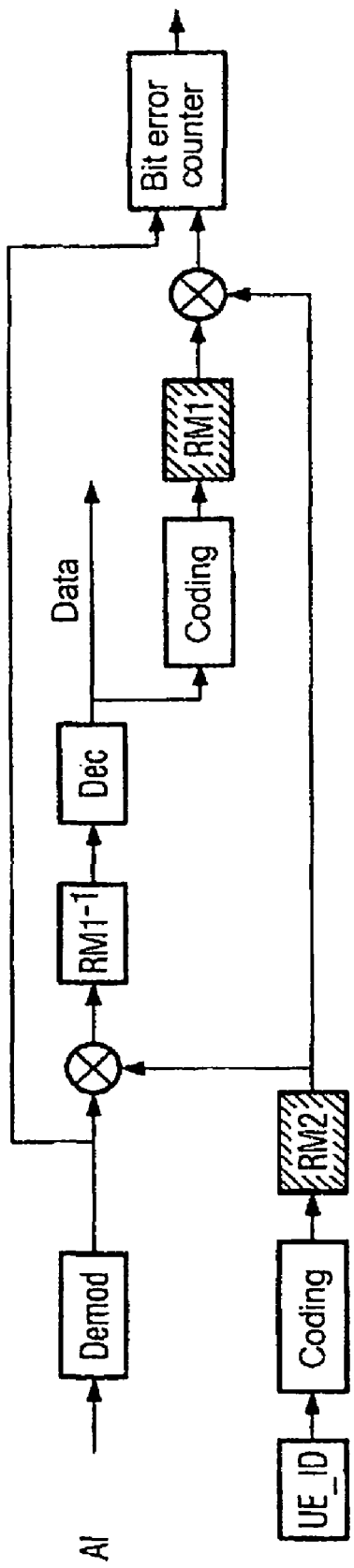
FIG. 5 shows an exemplary implementation on the recipient's side for receiving the HS-SCCH in the case of the specification currently employed (Release 99).

FIG. 5 shows an exemplary implementation in the receiving device as required by the present specification (Release 99). The transferred data TD is received via the air interface AI. Such transferred data TD is demodulated in the demodulator Demod. After being demodulated, such data is, on the one hand, routed directly to a bit error counter, and on the other hand, linked to the masking data via, for example, an XOR linking or multiplication operation. Such masking data is generated in the mobile station from the mobile station's identification number UE ID, which is coded then subjected to rate matching (RM2). Linking to the demodulated, transferred data TD takes places immediately thereafter. Rate matching RM2 of the masking data is necessary in order to match the bit lengths of the masking data to the bit length of the received data TD.

Rate matching $RM1^{-1}$ is rescinded for the linked signal prior to decoding Dec. Such data is decoded and, to check whether the information was intended for the respectively receiving mobile station, is coded again and subjected to further rate matching RM1 before being linked to the masking data again. The result of this relinking operation likewise flows into the bit error counter. Error detection is based here on a processing of 40 bits, which is to say as many bits as are transmitted over the air interface AI for each HS-SCCH subframe consisting of three time slots.

Figure 6:
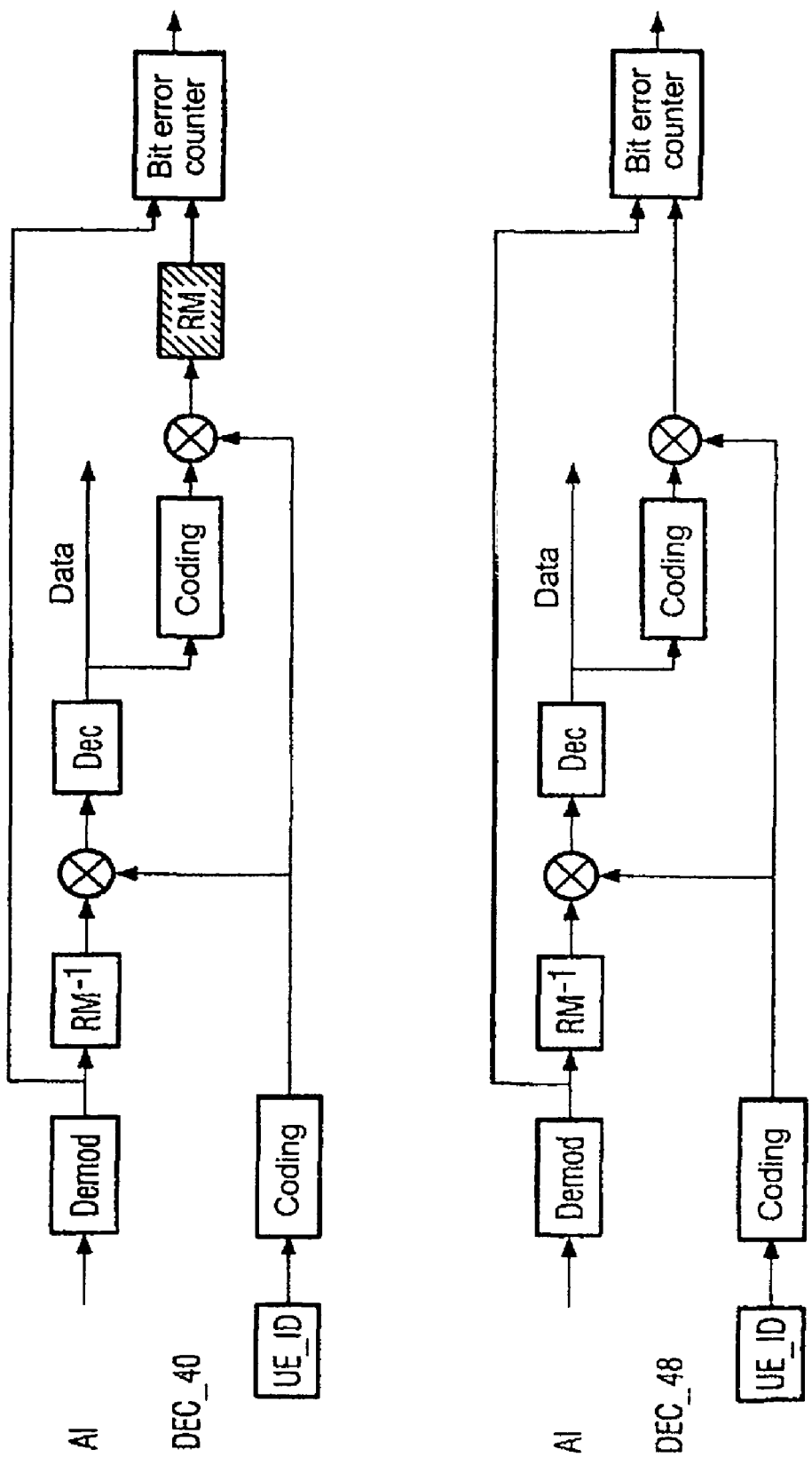
FIG. 6 is an exemplary embodiment of the implementation on the Recipient's side in the case of overall coding according to the proposal shown in FIG. 4.

FIG. 6 shows two exemplary implementations which can be used with rate matching performed according to the present invention.

In the top illustration (DEC_40), bit error detection in the bit error counter is likewise based on 40 bits. As the same rate matching pattern is used in the transmitter for identification data ID and load data LD, rate matching is first performed immediately ahead of the bit error counter jointly with the transferred data TD received over the air interface. In this way, there is a saving in one rate matching operation compared to the prior art; namely, as can be seen in FIG. 5, rate matching of the masking data prior to linking with the received data.

Specifically, the following steps are shown in the top example in FIG. 6:

The transferred data TD is received over the air interface AI. Such data is split up after a demodulation operation Demod and flows on the one hand in a first branch directly into a bit error counter. Rate matching $RM^{-1}$ is rescinded or cancelled in the other branch, followed by linking to the masking data generated by coding the mobile station identification number. In contrast to the implementation shown in FIG. 5, no rate matching of the masking data is necessary as rate matching of the transferred data was already rescinded prior to linking. The linked data undergoes decoding in a decoding operation Dec. On the one hand, the required data is then available; on the other hand, such data is subjected to coding in a further coding operation and linked to the masking data again. This is done for the purpose of error detection in the bit error counter into which the data flows after the relinking operation and a rate matching operation RM. To summarize, it means a saving in one rate matching operation is achieved compared to the implementation shown in FIG. 5. This is made possible by the use of a common rate matching pattern for load data LD and masking data ID in the transmitter. If different rate matching patterns were used, common rate matching in the rate matching unit RM in FIG. 6 ahead of the bit error counter would not lead, for instance, to the original signal.

Even clearer improvements, such as the saving of two rate matching operations, are achieved in the implementation shown in the lower illustration in FIG. 6.

In the lower illustration (DEC_48), bit error detection is based on 48 bits. In this case, it is only necessary to rescind rate matching. Further rate matching is not required.

Specifically, the following steps are performed in the lower illustration in FIG. 6: The transferred data TD is received over the air interface AI. Rate matching RM-I is then cancelled, an operation which is necessary because, on the one hand, the data is routed in a first branch directly to the bit error counter in which bit error detection takes place based on 48 bits. On the other hand, the data is linked in a second branch to the masking data generated in the mobile station from the mobile station identification number UE ID.

The required data is then available after linking and immediately ensuing decoding Dec. Analogously to the top example, for ensuing error detection the data is again subjected to coding Cod, then linked to the masking data. In contrast to the top example shown in FIG. 6, rate matching after linking is not necessary as there are 48 bits on the basis of which error detection is also performed. No rate matching is therefore required in this implementation.

Further Possible Applications

The joint use of rate matching patterns has been explained, in particular, for the HS-SCCH, but it is not restricted to this. Load data masking is also used for other control channels, as a consequence of which the present invention can be used. There are further applications basically for any channels in which different data streams are linked to each other for transmission and rate matching is required.

Although the present invention has been described with reference to specific embodiments, those of skill in the art will recognize that changes may be made thereto without departing from the spirit and scope of the present invention as set forth by the hereafter appended claims.

Sources:
R1-02-0605, "Coding and Rate Matching for HS-SCCH", TSG RAN WG1 Meeting #25, Paris, 09-12.04.2002.

What is claimed is:

1. A method for receiving data with a defined number of bits via a physical channel in a communications system, the physical channel being used by at least one first communication device and one second communication device, the method comprising:
   receiving data composed of load data and identification data;
   demodulating the received data;
   forwarding the demodulated data to a bit error counting device and performing a reversed rate matching of the demodulated data using a reversed rate matching pattern wherein a rate matching pattern defines which bits in a data stream are punctured or repeated, wherein the rate matching pattern for the load data and the identification data is identical;
   linking and decoding said reversed rate matched demodulated data.

2. A method for receiving data as claimed in claim 1, wherein the coding operation supplies a bit sequence of bits 1 to n in a defined time window by which the rate is defined, and rate matching is performed via a rate matching pattern by which individual bits in the bit sequence are punctured.

3. A method for receiving data as claimed in claim 1, wherein the physical channel is a High Speed Shared Control Channel.

4. A method for receiving data as claimed in claim 1, wherein the identification data is an identification number of a communication device.

5. A method for receiving data as claimed in claim 1, wherein the reverse rate matching occurs using a rate matching pattern by which bits at positions 1, 2, 4, 8, 42, 45, 47 and 48 are punctured in a bit sequence consisting of n =48 bits.

6. A method for receiving data as claimed in claim 5, wherein a position of the bits being punctured is shifted by a whole number k, where $0 < k \leq 5$.

7. A method for receiving data as claimed in claim 1, wherein linking is bit-by-bit linking.

8. A method for receiving data as claimed in claim 1, further comprising the steps of:
   coding said decoded data and linking said coded data;
   rate matching said linked data and feeding said rate matched data to said bit error counting device.

9. A method for receiving data as claimed in claim 1, further comprising the steps of:
   coding said decoded data and linking said coded data;
   feeding said linked data to said bit error counting device.

* * * * *